United States Patent
Rhee et al.

(10) Patent No.: US 9,040,994 B2
(45) Date of Patent: May 26, 2015

(54) THIN FILM TRANSISTOR, DISPLAY DEVICE AND MANUFACTURING THEREOF, DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Jeong Hun Rhee, Beijing (CN); Lianhua Che, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/048,477

(22) Filed: Oct. 8, 2013

(65) Prior Publication Data
US 2014/0097437 A1 Apr. 10, 2014

(30) Foreign Application Priority Data
Oct. 8, 2012 (CN) .......................... 2012 1 0377613

(51) Int. Cl.
*H01L 29/786* (2006.01)
(52) U.S. Cl.
CPC .... *H01L 29/78669* (2013.01); *H01L 29/78678* (2013.01); *H01L 29/7869* (2013.01)
(58) Field of Classification Search
CPC ........................ H01L 29/786; H01L 29/78669
See application file for complete search history.

(56) References Cited

U.S. PATENT DOCUMENTS

| | | | | |
|---|---|---|---|---|
| 7,884,365 B2 * | 2/2011 | Tak et al. | | 257/59 |
| 2005/0121674 A1 * | 6/2005 | Kamata et al. | | 257/72 |
| 2009/0278211 A1 * | 11/2009 | Kim et al. | | 257/411 |
| 2010/0133539 A1 | 6/2010 | Kang et al. | | |
| 2011/0046341 A1 * | 2/2011 | Ie et al. | | 528/380 |
| 2014/0125909 A1 | 5/2014 | Kim et al. | | |

FOREIGN PATENT DOCUMENTS

| | | |
|---|---|---|
| CN | 102254938 A | 11/2011 |
| CN | 102645803 A | 8/2012 |

OTHER PUBLICATIONS

First Chinese Office Action Appln. No. 201210377613,8; Dated Oct. 10, 2014.
Second Chinese Office Action dated Feb. 27, 2015; Appln. No. 201210377613.8.

\* cited by examiner

*Primary Examiner* — Allen Parker
(74) *Attorney, Agent, or Firm* — Ladas & Parry LLP (57) ABSTRACT

A thin-film transistor (TFT) comprises a gate electrode, a gate insulating layer, a source electrode and a drain electrode which are formed on a base substrate, the source electrode and the drain electrode are disposed on different layers and isolated from each other through a semiconductor connecting section made of an oxide semiconductor material; a position of the semiconductor connecting section corresponds to a position of the gate electrode; and at least one part of the source electrode and at least one part of the drain electrode overlap each other at a position corresponding to the semiconductor connecting section. A display device comprising the TFT and a display device comprising the display device are also disclosed.

7 Claims, 7 Drawing Sheets

THIN FILM TRANSISTOR, DISPLAY DEVICE AND MANUFACTURING THEREOF, DISPLAY APPARATUS

TECHNICAL FIELD

Embodiments of the present disclosure relate to a thin film transistor TFT, a display device and a manufacturing method thereof, and a display apparatus.

BACKGROUND

In an array substrate of a thin-film transistor liquid crystal display (TFT-LCD), a source metal electrode and a drain metal electrode are typically disposed on a same layer and usually have a planar structure respectively; and amorphous silicon having the function of a channel and acting as an active layer is provided under the source and drain metal electrodes. As the resistance can be increased when an amorphous silicon material makes direct contact with the source and drain metal electrodes so that the TFT cannot operate normally, an ohmic contact silicon layer containing phosphorus (P) composition may be additionally provided between the amorphous silicon and the source and drain metal electrodes respectively.

The carrier mobility of an oxide semiconductor material is more than 10 times faster than that of an amorphous silicon material. An oxide semiconductor not only can have the function of a channel but also cannot increase the resistance between the oxide semiconductor and metal wirings when making direct contact with the metal wirings, when employed as the active layer. Therefore, the ohmic contact silicon layers containing the P composition are not required any more. However, due to the instability of the oxide semiconductor to chemical agents, if the traditional TFT structure is adopted, the etching speed of the oxide semiconductor is faster than that of the source and drain metal electrodes, in the preparation process. In order to overcome the defect that an oxide semiconductor layer is etched together when the source and drain metal electrodes are formed by etching, an insulating layer capable of resisting etching is additionally disposed on the oxide semiconductor. It can be seen that the insulating layer will be always disposed between the source and drain electrodes and the active layer in the traditional TFT respectively, so that the complexity of the TFT hierarchy is increased and the production processes and the production cost can be increased as well.

SUMMARY

In one aspect, the present disclosure provides a thin film transistor (TFT), which comprises a gate electrode, a gate insulating layer, a source electrode and a drain electrode which are formed on a base substrate, and the source electrode and the drain electrode are disposed on different layers and isolated from each other through a semiconductor connecting section made of an oxide semiconductor material; a position of the semiconductor connecting section corresponds to a position of the gate electrode; and at least one part of the source electrode and at least one part of the drain electrode overlap each other at a position corresponding to the semiconductor connecting section.

In another aspect, the present disclosure further provides a display device comprising the above TFT.

In a still another aspect, the present disclosure further provides a display apparatus comprising the above display device.

In a still another aspect, the present disclosure further provides a method for manufacturing a display device, which comprises: forming a pattern of a gate line and a gate insulating layer on a base substrate; and forming patterns of a drain electrode, a source electrode and a semiconductor connecting section, in which the source electrode and the drain electrode are disposed on different layers and isolated from each other through a semiconductor connecting section; a position of the semiconductor connecting section corresponds to a position of the gate electrode; and at least one part of the source electrode and at least one part of the drain electrode overlap each other at a position corresponding to the semiconductor connecting section.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein:

FIG. 4b is a schematic structural plan view of the corresponding substrate in FIG. 4a;

FIG. 6b is a schematic structural plan view of the corresponding substrate in FIG. 6a;

FIG. 8b is a schematic structural plan view of the corresponding substrate in FIG. 8a;

DETAILED DESCRIPTION

The embodiments of the present disclosure are described in detail with reference to the accompanying drawings. The embodiments are only used for illustrating the present disclosure but are not intended to limit the scope of the present disclosure.

Embodiment 1

Figure 1:
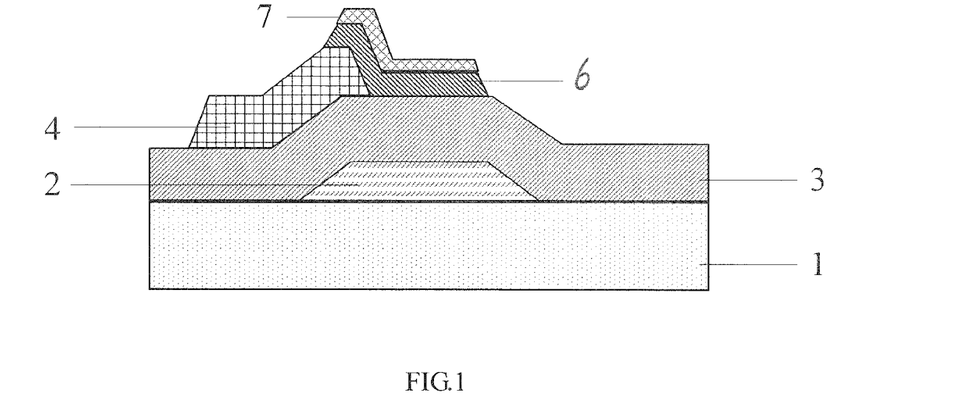
FIG. 1 is a schematic structural view of a TFT according to an embodiment of the present disclosure.

As illustrated in FIG. 1, the TFT according to this embodiment of the present disclosure comprises a base substrate 1, a gate electrode 2, a gate insulating layer 3, a drain electrode 4, a semiconductor connecting section 6 made of an oxide semiconductor material, and a source electrode 7, and the gate electrode 2 and the gate insulating layer 3 are formed on the base substrate in order. The embodiment is described by taking the TFT of a bottom-gate structure for example.

The semiconductor connecting section 6, acting as an active layer, may be made of indium zinc oxide ((IZO), doped IZO (e.g., indium gallium zinc oxide (IGZO)) or other similar oxide semiconductor materials. The base substrate 1 may be a glass or plastic substrate. The drain electrode 4 and the source electrode 7 may be prepared by a monolayer film made of a material selected from the group consisting of AlNd, Al, Cu, Mo, MoW and Cr or a composite film formed by any combination of AlNd, Al, Cu, Mo, MoW and Cr. The gate insulating layer may be prepared by a silicon nitride (SiNx) film or a silicon oxide (SiO2) film.

The differences from the traditional TFT structure are as follows: the source electrode 7 and the drain electrode 4 of the TFT in the embodiment are disposed on different layers relative to the base substrate 1 and isolated from each other by the semiconductor connecting section 6 which is disposed in an area on the gate insulating layer 3, corresponding to the gate electrode 2; the drain electrode 4 is disposed on the gate insulating layer 3 and on one side of the semiconductor connecting section 6 and makes contact with the semiconductor connecting section 6; and the source electrode 7 is disposed on the semiconductor connecting section 6. Moreover, at least one part of the source electrode 7 and at least one part of the drain electrode 4 overlap each other at a position corresponding to the semiconductor connecting section 6, that is, the source electrode 7 and the drain electrode 4 are at least partially opposite to each other via the semiconductor connecting section 6. Therefore, when a voltage is applied across the source electrode 7 and the drain electrode 4, a part of the semiconductor connecting section 6, sandwiched between the source electrode 7 and the drain electrode 4, can be converted into being conductive, so that a current channel can be formed. Meanwhile, it is understood by those skilled in the art that the drain electrode and the source electrode in the structure of the TFT may be exchanged as required.

In the structure, the source electrode 7 and the drain electrode 4 are disposed on different layers and isolated from each other by the semiconductor connecting section 6; and at least one part of the source electrode 7 and at least one part of the source electrode 4 overlap each other, and the source electrode 7 covers the semiconductor connecting section 6. Therefore, no additional insulating layer is required for preventing the semiconductor connecting section 6 from being damaged by etching liquid when the source-drain metals are etched in the preparation process. As no additional insulating layer is required to be prepared in the process of preparing the TFT in the embodiment, the hierarchy is simplified and the processes and the cost are saved.

For instance, the thickness of the drain electrode 4 may be more than the thickness of the semiconductor connecting section 6. Moreover, the contact surface of the semiconductor connecting section 6 with the drain electrode 4 can be extended up to the top of the drain electrode 4, so that the contact surface of the semiconductor connecting section 6 and the drain electrode 4 can be increased and the contact surface of the semiconductor connecting section 6 with the source electrode 7 can be increased as well, and hence the function of the channel can be enhanced.

As illustrated in FIG. 1, as the source electrode 7 and the drain electrode 4 are disposed on different layers, the TFT also has the advantages of a compact structure and a small volume compared with the traditional TFT.

Embodiment 2

The embodiment provides a display device adopting the TFT structure in the embodiment 1. For instance, the display device may be an array substrate of a liquid crystal display (LCD) or an array substrate of an active matrix organic light-emitting diode (AMOLED) structure.

In an LCD, an array substrate and a counter substrate are arranged opposite to each other to form a liquid crystal cell which is filled with a liquid crystal material. The counter substrate, for instance, is a color filter substrate. In the AMOLED, an overcoat layer of an organic luminescent material is formed on the array substrate, and a pixel electrode of each pixel cell is used as an anode or a cathode and configured to drive the organic luminescent materials to emit light.

The description is given below by taking the array substrate of the LCD for example. In the process of manufacturing the array substrate, the whole TFT may be arranged on one side of a gate line.

As for the LCD, the array substrate of the embodiment of the present disclosure, for instance, comprises a plurality of gate lines and a plurality of data lines, and the gate lines and the data lines are intersected to define pixel cells arranged in a matrix; and each pixel cell includes a TFT acting as a switching element and a pixel electrode configured to control the arrangement of liquid crystals. For instance, a gate electrode of the TFT of each pixel cell is electrically connected or integrally formed with corresponding gate lines; a source electrode is electrically connected or integrally formed with corresponding data lines; and a drain electrode is electrically connected or integrally formed with corresponding pixel electrode.

As the TFT of the embodiment 1 has a small volume, in the embodiment, a part of the TFT is disposed on the corresponding gate line, and a part of the gate line is taken as the gate electrode of the TFT. Therefore, the aperture ratio of the array substrate can be further improved.

Figure 2:
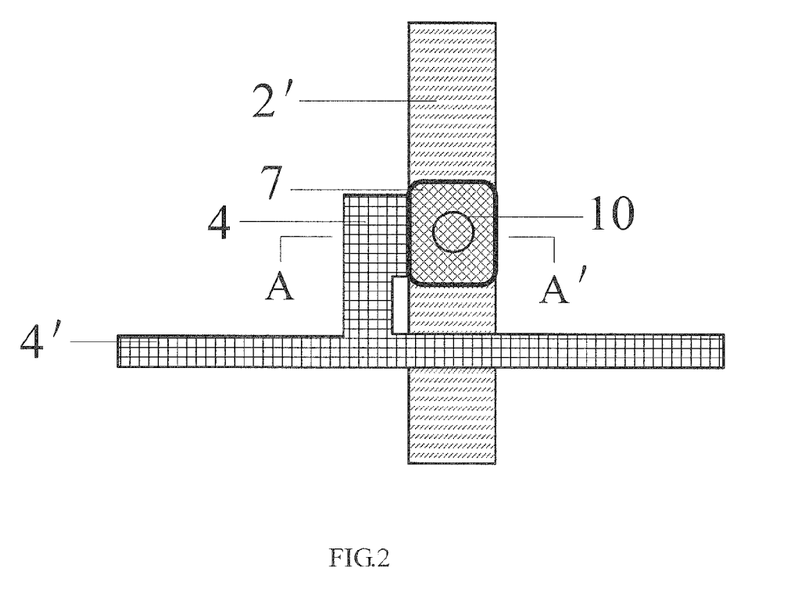
FIG. 2 is a schematic structural view of a display device according to an embodiment of the present disclosure.
Figure 3:
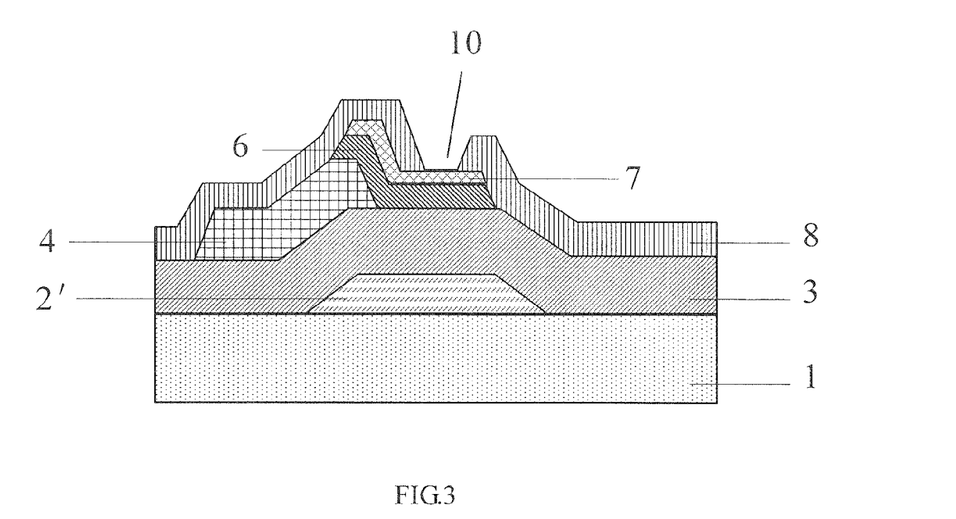
FIG. 3 is a schematic sectional view of FIG. 2 along the A-A' direction.

In the embodiment, the structure of the array substrate is illustrated in FIGS. 2 and 3. The array substrate comprises a base substrate 1, a gate line 2', a data line 4', the TFT of the embodiment 1 (including the gate electrode, the gate insulating layer 3, the drain electrode 4, the semiconductor connecting section 6 made of an oxide semiconductor material, and the source electrode 7), a passivation layer 8, and a via hole 10. The passivation layer may be prepared by a film made of an inorganic material such as silicon nitride (SiNx), silicon oxide (SiO2), silicon oxynitride (SiNxOy) or the like or an organic material such as a resin.

In the embodiment, one part of the gate line 2' is taken as the gate electrode of the TFT; the source electrode 7 and the drain electrode 4 of the TFT are disposed on different layers and isolated from each other by the semiconductor connecting section 6 which is disposed in an area on the gate insulating layer 3, corresponding to the gate line 2'; the drain electrode 4 is disposed on the gate insulating layer 3 and on one side of the semiconductor connecting section 6 and makes contact with the semiconductor connecting section 6; the source electrode 7 is disposed on the semiconductor connecting section 6; at least one part of the source electrode 7 and at least one part of the drain electrode 4 overlap each other at the position corresponding to the semiconductor connecting section 6; an area where the drain electrode 4 is located is disposed on one side of an area of the gate lines 2'; and the drain electrode 4 is connected with the data lines 4'. As seen from a plan view of the example as illustrated in FIG. 2, the straight line in the arrangement direction of the drain electrode 4, the source electrode 7 and the semiconductor connecting section 6 is perpendicular to the gate lines 2'.

In the structure, the drain electrode 7 and the source electrode 4 are disposed on different layers and isolated from each other by the semiconductor connecting section 6, and at least one part of the source electrode 7 and at least one part of the source electrode 4 overlap each other, and the source electrode 7 covers the semiconductor connecting section 6. Therefore, no additional insulating layer is required for preventing the semiconductor connecting section 6 from being damaged by an etching liquid when source-drain metals are etched in the preparation process. As no additional insulating layer is required to be prepared in the process of preparing the TFT in the embodiment, the hierarchy is simplified and the process and the cost are saved.

For instance, the thickness of the drain electrode 4 may be more than the thickness of the semiconductor connecting section 6. Moreover, the contact surface of the semiconductor connecting section 6 with the drain electrode 4 may be extended up to the top of the drain electrode 4, so that the contact surface of the semiconductor connecting section 6 and the drain electrode 4 can be increased and a contact surface of the semiconductor connecting section 6 and the source electrode 7 can be increased as well, and hence the function of the channel can be enhanced.

For instance, the via hole 10 in the passivation layer 8 is formed in an area corresponding to the gate line 2' and does not occupy the transmission area in a pixel, so that the aperture ratio of the pixel can be improved.

The embodiment further provides a method for manufacturing the display device. An example of the method comprises the following steps.

Figure 4A:
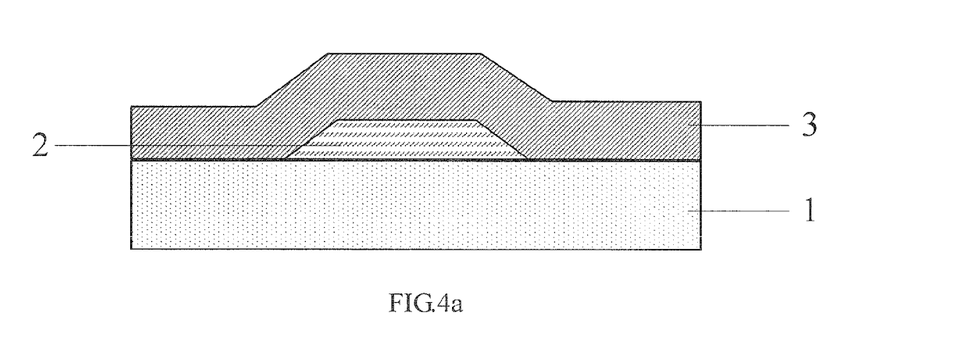
FIG. 4a is a schematic structural sectional view of a substrate, on which a gate electrode and a gate insulating layer are formed, in a method for manufacturing the TFT, according to an embodiment of the present disclosure.
Figure 4B:
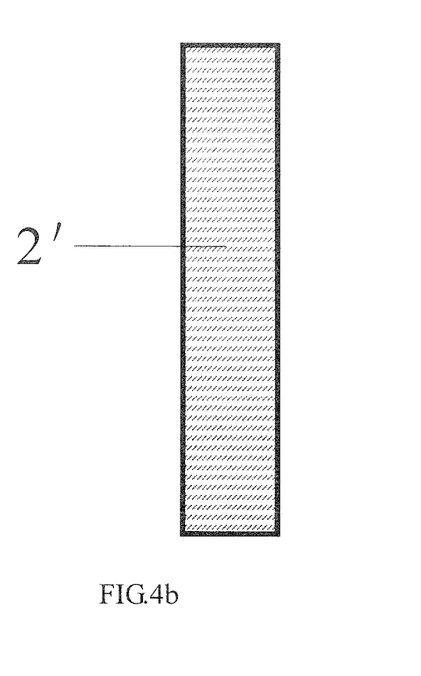

Step 1: forming a pattern of the gate line 2' and the gate insulating layer 3 on the base substrate 1, as illustrated in FIG. 4a, and FIG. 4b is a schematic diagram of the pattern of the gate line 2' formed on the array substrate, and a part of the gate line 2' is taken as the gate electrode of the TFT.

Step 2: forming patterns of the drain electrode 4, the source electrode 7 and the semiconductor connecting section 6 on the base substrate in FIG. 4a, so that the source electrode 7 and the drain electrode 4 are disposed on different layers and isolated from each other by the semiconductor connecting section 6. An example of the step is as follows.

Figure 5:
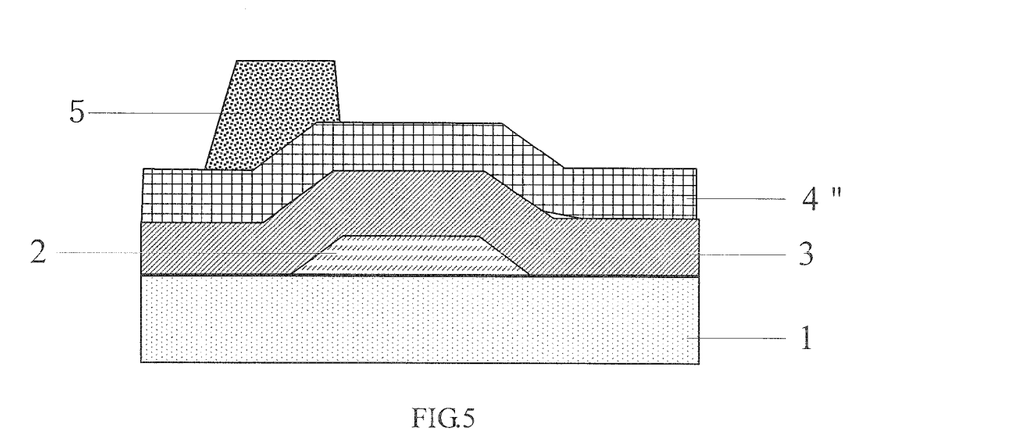
FIG. 5 is a schematic structural sectional view of a substrate at the TFT position, obtained after depositing a drain electrode metal layer on the substrate in FIG. 4a and retaining part of photoresist.
Figure 6A:
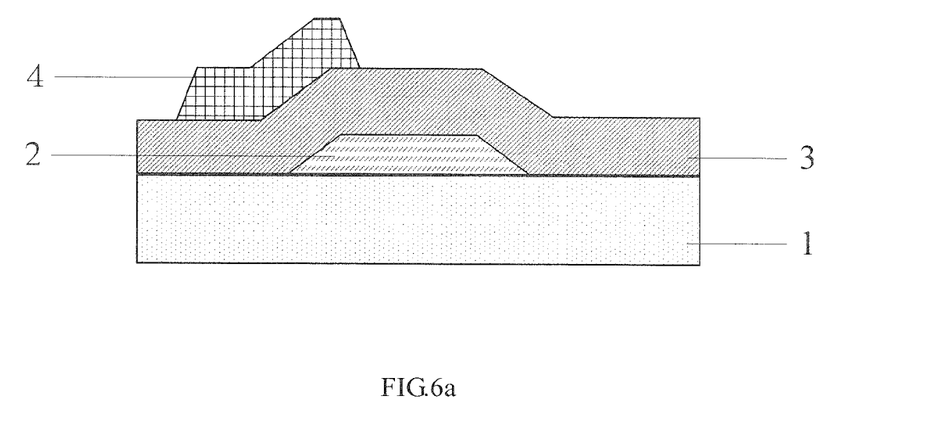
FIG. 6a is a schematic structural sectional view of a substrate obtained after forming a pattern of a drain electrode.
Figure 6B:
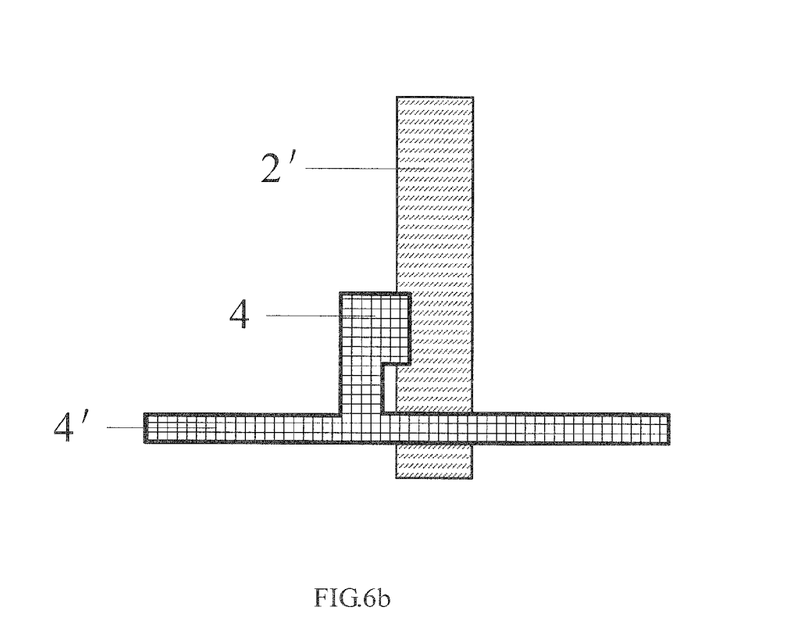

As illustrated in FIG. 5, a first metal film 4" is formed (e.g., by deposition) on the gate insulating layer 3, and hence patterns of the drain electrode 4 and the data line 4' are obtained by the patterning of the first metal film 4", as illustrated in FIGS. 6a and 6b. For instance, a layer of photoresist 5 is coated on the first metal film 4"; a photoresist pattern is obtained by retaining the photoresist 5 in a drain electrode area on the gate insulating layer through the exposure and development processes on the photoresist; and the exposed first metal film 4" is etched by adoption of the photoresist pattern as an etching mask; and the residual photoresist 5 is removed to form the patterns of the drain electrode 4 and the data line 4'. FIG. 6b illustrates the drain electrode on the array substrate and the data line 4' connected therewith.

Figure 7:
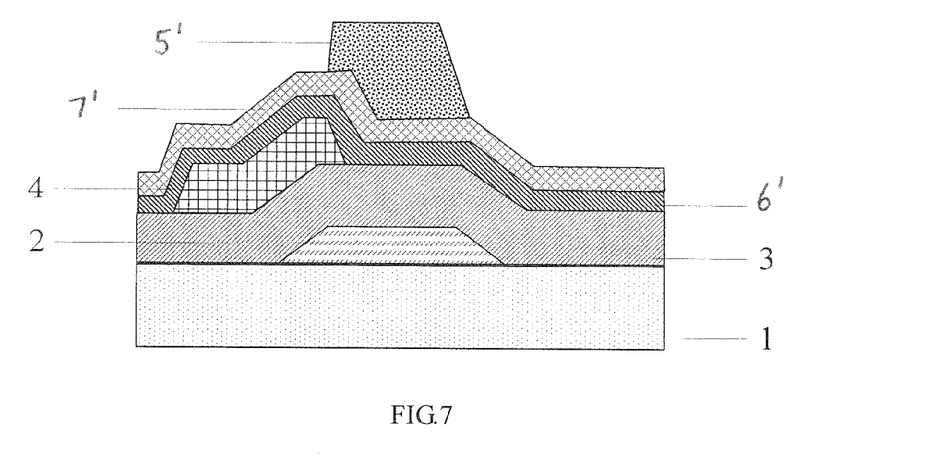
FIG. 7 is a schematic structural sectional view of a substrate, obtained after depositing an oxide semiconductor film and a source electrode metal film on the substrate in FIG. 6a and retaining part of photoresist.
Figure 8A:
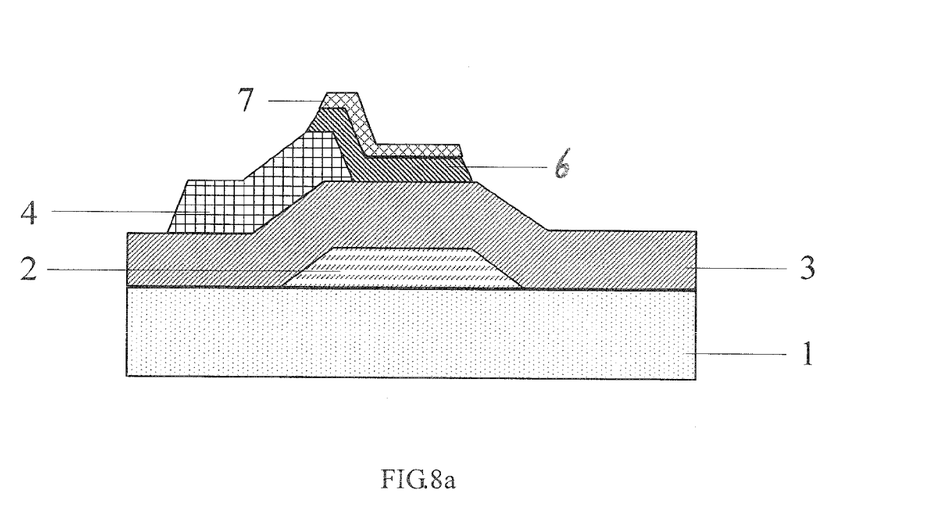
FIG. 8a is a schematic structural sectional view of a substrate obtained after forming patterns of a semiconductor connecting section and a drain electrode.
Figure 8B:
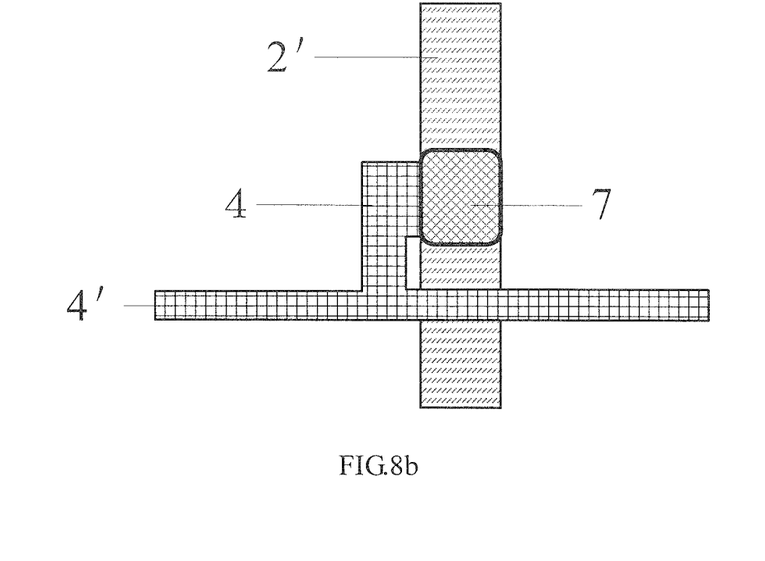

As illustrated in FIG. 7, an oxide semiconductor film 6' and a second metal film 7' are deposited on the base substrate, on which the pattern of the drain electrode 4 is formed, in order, and the laminated structure of the oxide semiconductor film 6' and the second metal film 7' is patterned to form the patterns of the semiconductor connecting section 6 and the source electrode 7, as illustrated in FIGS. 8a and 8b. For instance, a layer of photoresist 5' is coated on the second metal film 7'; a photoresist pattern is obtained by retaining the photoresist 5' in relevant areas, including the gate electrode area and partial drain electrode area adjacent to the gate electrode area, through the exposure and development processes on the photoresist 5'; and the exposed oxide semiconductor film 6' and the exposed second metal film 7' are etched by adoption of the photoresist pattern as an etching mask. For instance, the exposed oxide semiconductor film 6' and the exposed second metal film 7' are etched at the same time by wet etching, so that an oxide semiconductor cannot be damaged due to the fact that the etching speed of the oxide semiconductor is faster than that of the source electrode. After the etching step is finished, the residual photoresist 5' is removed to form the patterns of the semiconductor connecting section 6 and the source electrode 7. For instance, the thickness of the deposited first metal film 4" is more than that of the oxide semiconductor film 6', so that the contact surface of the semiconductor connecting section 6 with the source electrode 7 can be increased.

Figure 9:
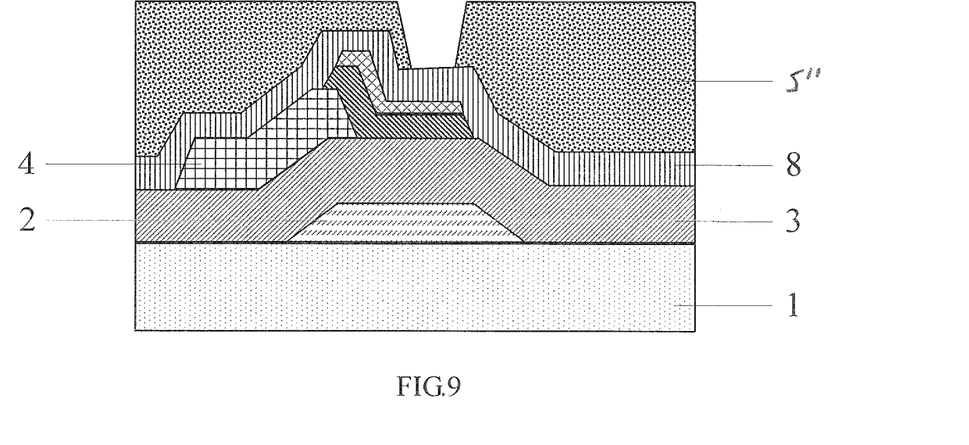
FIG. 9 is a schematic structural sectional view of a substrate, obtained after depositing a passivation layer film on the substrate in FIG. 8a and retaining part of photoresist.

Step 3: forming patterns of the passivation layer and the via hole. An example of the step is as follows:

As illustrated in FIG. 9, an insulating layer film is deposited to form the passivation layer 8, and the via hole 10 is obtained by the patterning of the passivation layer 8. For instance, a layer of photoresist 5" is coated on the passivation layer 8; a photoresist pattern is obtained by removing the photoresist 5" in a via hole area through the exposure and development processes on the photoresist 5"; the passivation layer in the via hole area is etched by adoption of the photoresist pattern as an etching mask; the residual photoresist 5" is removed to form the via hole 10; and the array substrate as illustrated in FIGS. 2 and 3 is finally formed. For instance, the via hole area is contained in the gate line area, so that the aperture ratio of the pixel can be improved.

Embodiment 3

The embodiment provides a display device adopting the TFT structure in the embodiment 1. The display device may be an array substrate of an LCD or an array substrate of an AMOLED. The description is given below by taking the array substrate of the LCD for example.

Figure 10:
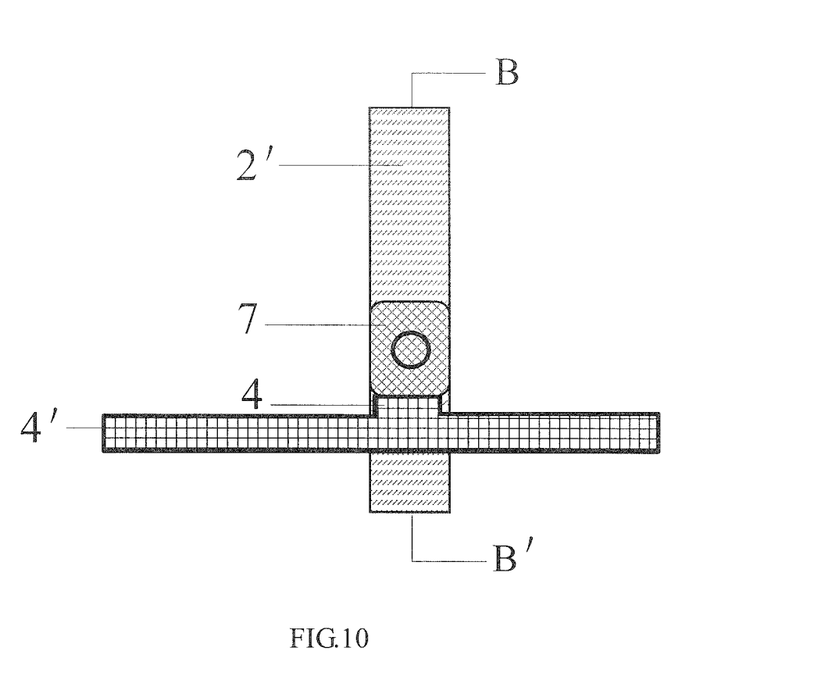
FIG. 10 is a schematic structural view of another display device according to an embodiment of the present disclosure.
Figure 11:
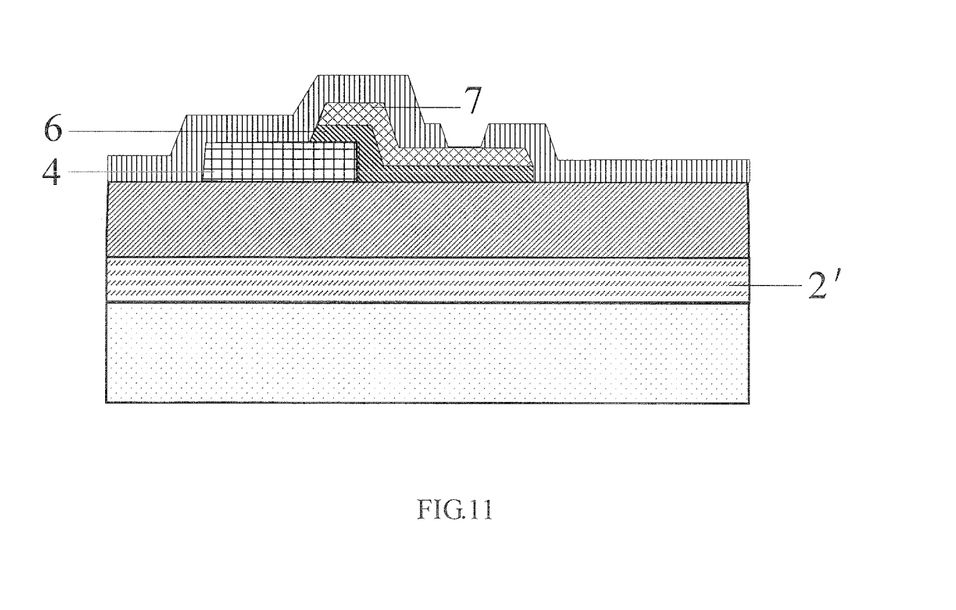
FIG. 11 is a schematic sectional view of FIG. 10 in the B-B' direction.

The differences of the array substrate from that of the embodiment 2 are as follows: the whole TFT is disposed on the corresponding gate line; one part of the gate line is taken as the gate electrode, and the structure of the array substrate is as illustrated in FIGS. 10 and 11; and areas where the drain electrode 4, the source electrode 7 and the semiconductor connecting section 6 are located are disposed in an area of the gate line 2', namely the drain electrode 4, the source electrode 7 and the semiconductor connecting section 6 are all disposed on the gate line 2' and overlapped with the gate line 2' in the direction perpendicular to the base substrate. For instance, the straight line in the arrangement direction of the source electrode 4, the drain electrode 7 and the semiconductor connecting section 6 is parallel to the gate line 2', and the drain electrode 4 is integrally formed with the data lines 4'. Therefore, the whole TFT can be conveniently disposed on the gate line 2'. As the specific TFT structure and the manufacturing flow thereof are basically the same as those of the embodiment 1, no further description will be given herein for simplicity.

The drain electrode 4 and the corresponding data line 4' are integrally formed in the embodiment. Moreover, light for display can also pass through a peripheral area of the gate line 2', so that the aperture ratio can be improved compared with the array substrate in the embodiment 1.

Embodiment 4

The embodiment provides a display apparatus comprising the display device provided by the embodiment 2 or 3. The display apparatus may be an LCD panel, electronic paper, an organic light-emitting diode (OLED) panel, an LCD television, an LCD monitor, a digital picture frame, a mobile phone, a tablet PC or any other product or component with display function.

The embodiment of the disclosure being thus described, it will be obvious that the same may be varied in many ways. Such variations are not to be regarded as a departure from the spirit and scope of the disclosure, and all such modifications as would be obvious to those skilled in the art are intended to be included within the scope of the following claims.

What is claimed is:

1. A thin-film transistor (TFT),
comprising
 a gate electrode,
 a gate insulating layer,
 a source electrode and
 a drain electrode formed on a base substrate,
wherein
 the source electrode and the drain electrode are
  disposed on different layers and
  isolated from each other through a semiconductor connecting section made of an oxide semiconductor material;
 a position of the semiconductor connecting section corresponding to a position of the gate electrode; and
 at least one part of the source electrode and at least one part of the drain electrode overlap each other at a position corresponding to the semiconductor connecting section;
wherein
 the drain electrode
  is disposed
   on the gate insulating layer and
   on one side of the semiconductor connecting section and
  makes contact with the semiconductor connecting section; and
 the source electrode is disposed on and fully covers an upper surface of the semiconductor connecting section.

2. The TFT according to claim 1, wherein a thickness of the drain electrode is more than that of the semiconductor connecting section; and
 a contact surface of the semiconductor connecting section with the drain electrode is extended up to a top of the drain electrode.

3. A display device, comprising the TFT according to claim 1.

4. The display device according to claim 3, wherein the display device further comprises a passivation layer formed on the TFT; and
 the passivation layer is provided with a via hole in an area corresponding to the gate electrode of the TFT.

5. The display device according to claim 4, wherein the TFT employs a part of a corresponding gate line of the display device as the gate electrode;
 the drain electrode on the base substrate is disposed on one side of the corresponding gate line;
 the drain electrode is connected with a data line of the display device; and
 a straight line in an arrangement direction of the drain electrode, the source electrode and the semiconductor connecting section is perpendicular to the corresponding gate line.

6. The display according to claim 4, wherein the TFT employs a part of a corresponding gate line as the gate electrode;
 the drain electrode is connected with a data line of the display device;
 the drain electrode, the source electrode and the semiconductor connecting section are disposed in an area of the gate line; and
 a straight line in an arrangement direction of the drain electrode, the source electrode and the semiconductor connecting section is parallel to the corresponding gate line.

7. A display device, comprising the display device according to claim 4.

* * * * *